United States Patent
Wang et al.

(10) Patent No.: US 6,730,576 B1
(45) Date of Patent: May 4, 2004

(54) METHOD OF FORMING A THICK STRAINED SILICON LAYER AND SEMICONDUCTOR STRUCTURES INCORPORATING A THICK STRAINED SILICON LAYER

(75) Inventors: Haihong Wang, Fremont, CA (US); Paul R. Besser, Sunnyvale, CA (US); Jung-Suk Goo, Stanford, CA (US); Minh V. Ngo, Fremont, CA (US); Eric N. Paton, Morgan Hill, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/335,447

(22) Filed: Dec. 31, 2002

(51) Int. Cl.⁷ .................. H01L 21/762; H01L 21/205
(52) U.S. Cl. .................. 438/413; 438/296; 438/503
(58) Field of Search .................. 438/413, 503, 438/507, 294, 295, 296; 148/33.4, 33.5

(56) References Cited

U.S. PATENT DOCUMENTS

| | | | | |
|---|---|---|---|---|
| 6,013,134 A | * | 1/2000 | Chu et al. .................. | 118/715 |
| 6,525,338 B2 | * | 2/2003 | Mizushima et al. .......... | 257/19 |
| 6,583,015 B2 | * | 6/2003 | Fitzgerald et al. .......... | 438/287 |
| 6,593,191 B2 | * | 7/2003 | Fitzgerald .................. | 438/282 |
| 6,645,836 B2 | * | 11/2003 | Kanzawa et al. .......... | 438/509 |
| 6,649,492 B2 | * | 11/2003 | Chu et al. .................. | 438/478 |
| 2002/0197803 A1 | * | 12/2002 | Leitz et al. .................. | 438/285 |
| 2003/0057439 A1 | * | 3/2003 | Fitzgerald .................. | 257/192 |
| 2003/0207571 A1 | * | 11/2003 | Fitzgerald et al. .......... | 438/689 |

* cited by examiner

Primary Examiner—Mary Wilczewski
(74) Attorney, Agent, or Firm—Foley & Lardner LLP (57) ABSTRACT

A strained silicon layer is grown on a layer of silicon germanium and a layer of silicon germanium is grown on the strained silicon in a single continuous in situ deposition process with the strained silicon. Shallow trench isolations are formed in the lower layer of silicon germanium prior to formation of the strained silicon layer. The two silicon germanium layers effectively provide dual substrates at both surfaces of the strained silicon layer that serve to maintain the tensile strain of the strained silicon layer and resist the formation of misfit dislocations that might otherwise result from temperature changes during processing. Consequently the critical thickness of strained silicon that can be grown without significant misfit dislocations during later processing is effectively doubled for a given germanium content of the silicon germanium layers. The formation of shallow trench isolations prior to formation of the strained silicon layer avoids subjecting the strained silicon layer to extreme thermal stresses and further reduces the formation of misfit dislocations.

20 Claims, 7 Drawing Sheets

METHOD OF FORMING A THICK STRAINED SILICON LAYER AND SEMICONDUCTOR STRUCTURES INCORPORATING A THICK STRAINED SILICON LAYER

BACKGROUND OF THE INVENTION

1. Field of the Invention

The present invention relates to semiconductor integrated circuits, and in particular to semiconductor devices that incorporate strained silicon.

2. Related Technology

The continuous demand for improved performance in electronic devices has been addressed through advances in silicon processing and device technologies directed toward reduction in the size of individual semiconductor circuit components. However, economic and physical constraints are making continued reduction of device sizes more difficult, and so alternative solutions are being sought to allow increases in device performance to continue.

One option for increasing the performance of MOSFETs is to enhance the carrier mobility of silicon so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is generally more widely spaced than a pure silicon lattice as a result of the presence of the larger germanium atoms in the lattice. Because the atoms of the silicon lattice align with the more widely spread silicon germanium lattice, a tensile strain is created in the silicon layer. The silicon atoms are essentially pulled apart from one another. The amount of tensile strain applied to the silicon lattice increases with the proportion of germanium in the silicon germanium lattice.

Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

Figure 1:
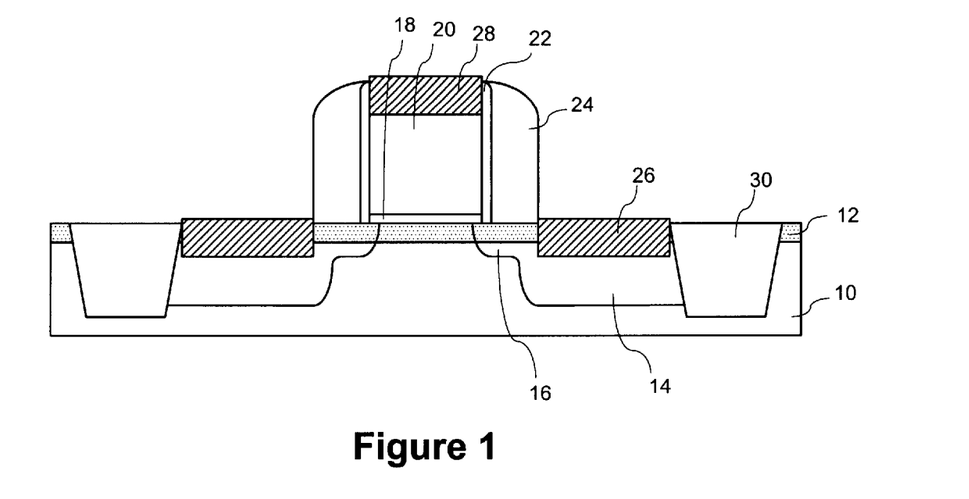
FIG. 1 shows a MOSFET using a layer of strained silicon formed in accordance with conventional processing.

An example of a MOSFET using a strained silicon layer is shown in FIG. 1. The MOSFET is fabricated on a substrate comprising a silicon germanium layer 10 on which is formed an epitaxial layer of strained silicon 12. The MOSFET uses conventional MOSFET structures including deep source and drain regions 14, shallow source and drain extensions 16, a gate oxide layer 18, a gate 20 surrounded by spacers 22, 24, silicide source and drain contacts 26, a silicide gate contact 28, and shallow trench isolations 30. The channel region of the MOSFET includes the strained silicon material, which provides enhanced carrier mobility between the source and drain.

While the theoretical advantages of strained silicon are promising, the fabrication and processing of strained silicon presents a number of problems. One problem is the formation of "misfit dislocations" in the strained silicon as the result of temperature changes. Misfit dislocations are dislocations in the silicon lattice that effectively release the strain applied to the silicon lattice. Misfit dislocations are primarily caused by mismatch between the strained silicon lattice and the lattice of the underlying silicon germanium supporting layer. The amount of misfit dislocations in a strained silicon layer may increase as the result of thermal factors. One instance in which misfit dislocations may be caused by thermal factors is during cooling after deposition of a strained silicon layer. Another instance in which misfit dislocations may occur is during exposure to high temperatures, e.g. 1000 degrees C. and higher, such as during formation of shallow trench isolations. Such high temperatures are believed to cause depletion of the germanium content of the silicon germanium substrate, leading to formation of misfit dislocations in the overlying strained silicon. The rate of formation of misfit dislocations rises exponentially with increases in temperature.

has been determined that a strained silicon layer has a critical thickness, above which misfit dislocations become significantly more likely to occur. The critical thickness depends on the amount of tensile strain applied to the silicon lattice, and thus on the germanium content of the underlying silicon germanium layer. For example, it has been determined that a silicon germanium layer having approximately 20% germanium content can support a critical thickness of approximately 200 Angstroms without the risk of significant misfit dislocations, whereas a silicon germanium layer having approximately 30% germanium content can support a critical thickness of only approximately 80 Angstroms.

Therefore the application of current strained silicon technology to MOSFET design is hampered by conflicting limitations, in that strained silicon carrier mobility is enhanced by an increase in the germanium content of the underlying layer, yet the critical thickness of the strained silicon is reduced by an increase of the germanium content of the underlying layer. These conflicts make practical applications difficult to achieve. For example, it has been determined empirically that at least approximately 70 Angstroms of strained silicon are required to provide a meaningful improvement in MOSFET performance. However, in order to account for consumption of silicon during processing, a layer of approximately double that thickness must be formed initially, and to avoid misfit dislocation in a layer of such thickness, the germanium content of the underlying layer must be restricted to approximately 20%. The resulting strain applied to the strained silicon layer has been found to have relatively little effect on hole mobility, and therefore it is difficult to provide a meaningful application of strained silicon in PMOS devices. In addition to the foregoing considerations, the tensile strain of the strained silicon layer and hence its carrier mobility may be further degraded through the formation of misfit dislocations caused by both the increases and the decreases in temperature that are typically encountered during processing, such as during formation of shallow trench isolations. Therefore, while the limiting factors of strained silicon technology can be balanced to achieve limited carrier mobility enhancement in some applications, current technology does not offer a way to impart enough strain to produce significant carrier mobility enhancement without also introducing mobility-reducing defects and strain relaxation.

SUMMARY OF THE INVENTION

It is therefore an object of the present invention to provide a strained silicon layer having a thickness greater than the conventional critical thickness yet not having the amount of misfit dislocations that are characteristic of a strained silicon layer having a thickness greater than the conventional critical thickness.

It is another object of the present invention to provide a MOSFET device that incorporates a strained silicon layer having a thickness greater than the conventional critical thickness.

In accordance with embodiments of the invention, shallow trench isolations are formed in a silicon germanium layer prior to growth of a strained silicon layer on the silicon germanium layer. Subsequently, a strained silicon layer is fabricated on the layer of silicon germanium and a second silicon germanium layer is formed over the layer of strained silicon in a single continuous in situ deposition process. This construction effectively provides dual substrates at both surfaces of the strained silicon layer for maintaining the tensile strain of the strained silicon layer and resisting the formation of misfit dislocations. Consequently the thickness of strained silicon that can be grown without a substantial risk of susceptibility to significant misfit dislocations as the result of subsequent heating and cooling is effectively doubled for a given germanium content of the silicon germanium layers. In addition, the formation of shallow trench isolations prior to growth of the strained silicon layer avoids subjecting the strained silicon layer to the thermal cycle of shallow trench isolation growth and therefore further protects the strained silicon layer.

In accordance with one embodiment of the invention, a strained silicon layer is formed between dual silicon germanium layers. Initially a substrate having a first layer of silicon germanium is provided. A layer of strained silicon is then formed on the first layer of silicon germanium, and a second layer of silicon germanium is formed on the strained silicon layer in a single continuous in situ deposition process. The first and second silicon germanium layers maintain the tensile strain of the strained silicon layer and resist the formation of misfit dislocations during subsequent cooling and heating of the strained silicon layer.

In accordance with a further embodiment of the invention, a semiconductor structure includes a first layer of silicon germanium, a layer of strained silicon grown on the first layer of silicon germanium, and a second layer of silicon germanium grown on the strained silicon layer. The first and second silicon germanium layers support the tensile strain of the strained silicon layer and resist formation of misfit dislocations in the strained silicon layer.

In accordance with another embodiment of the invention, a semiconductor device comprising a thick strained silicon layer is formed. Initially a substrate having a first layer of silicon germanium is provided. Shallow trench isolations are formed in the first layer of silicon germanium. A layer of strained silicon is then formed on the first layer of silicon germanium, and a second layer of silicon germanium is formed on the strained silicon layer in a single continuous in situ deposition process with the strained silicon layer. The first and second silicon germanium layers support the tensile strain of the strained silicon layer and resist formation of misfit dislocations in the strained silicon layer during subsequent cooling and heating of the strained silicon layer. The second layer of silicon germanium is subsequently removed, and a MOSFET comprising the layer of strained silicon is formed between the shallow trench isolations.

In accordance with another embodiment of the invention, a MOSFET comprises a channel region, a gate insulator formed over the channel region, a gate formed on the gate insulator, and source and drain regions located on opposing sides of the channel regions. At least the channel region of the MOSFET is comprised of a layer of strained silicon having a thickness that is greater than a critical thickness determined in accordance with a germanium content of a silicon germanium layer on which the strained silicon layer is formed.

DESCRIPTION OF THE DRAWINGS

Embodiments of the invention are described in conjunction with the following drawings, in which.

DESCRIPTION OF PREFERRED EMBODIMENTS

Figure 2A:
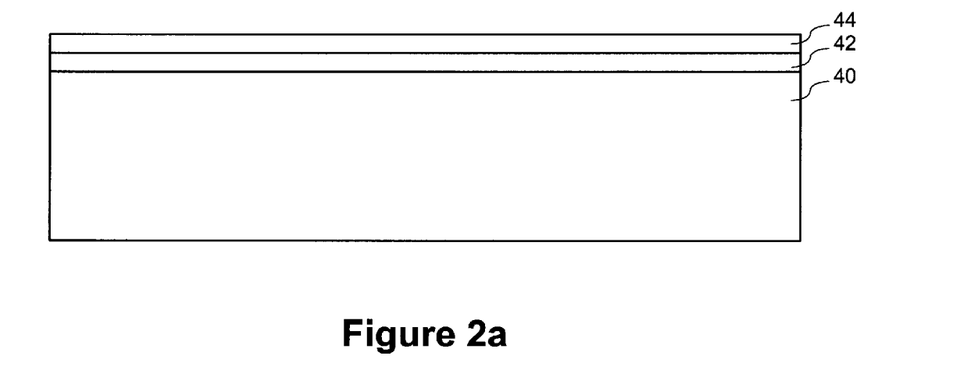
FIGS. 2a, 2b, 2c, 2d, 2e, 2f, 2g, 2h, 2i, 2j, 2k and 2L show structures formed during production of a MOSFET in accordance with a first preferred embodiment of the invention.

FIGS. 2a–2L show structures formed during fabrication of a strained silicon MOSFET in accordance with a preferred embodiment of the invention. FIG. 2a shows a structure comprising a silicon germanium layer 40. The silicon germanium layer 40 preferably has a composition $Si_{1-x}Ge_x$, where x is approximately 0.3, and is more generally in the range of 0.1 to 0.4. The silicon germanium layer 40 is typically grown on and supported by a silicon wafer (not shown). Silicon germanium may be grown, for example, by chemical vapor deposition using $Si_2H_6$ (disilane) and $GeH_4$ (germane) as source gases, with a substrate temperature of 600–900 degrees C., a $Si_2H_6$ partial pressure of 30 mPa, and a $GeH_4$ partial pressure of 60 mPa. $SiH_4$ (silane) may be used in alternative processes. Growth of the silicon germanium layer 40 may be initiated using these ratios, or alternatively the partial pressure of $GeH_4$ may be gradually increased beginning from a lower pressure or zero pressure to form a gradient composition having the desired germanium content (e.g. 30%) at an upper portion that will form a junction with a later formed strained silicon layer.

Formed on the silicon germanium layer 40 is a bi-layer hardmask structure comprising a bottom hardmask layer 42, also referred to as a bottom antireflective coating (BARC), and an upper hardmask layer 44. The bottom hardmask layer 42 is typically silicon oxide (e.g. $SiO_2$) and the upper hardmask layer 44 is typically silicon nitride (e.g. $Si_3N_4$).

Figure 2B:
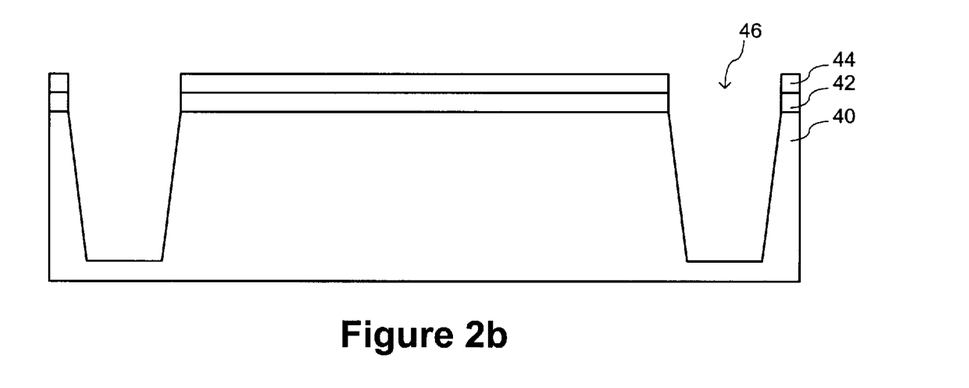
Figure 2C:
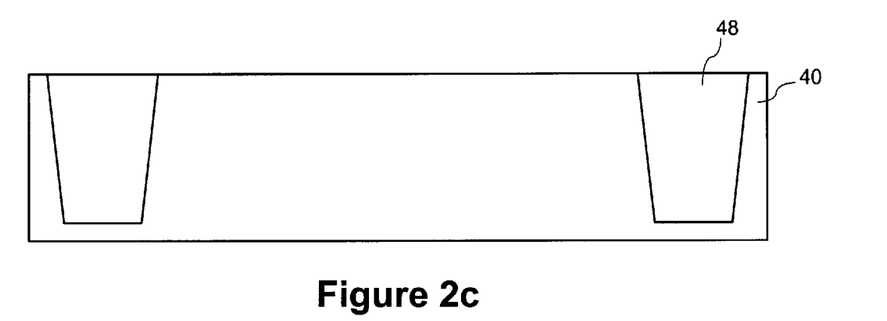

FIG. 2b shows the structure of FIG. 2a after patterning of the silicon germanium layer 40 using the bi-layer hardmask to form trenches 46 having tapered sidewalls. FIG. 2c shows the structure of FIG. 2b after removal of the bi-layer hardmask materials from the silicon germanium layer 40, followed by formation of shallow trench isolations 48 in the trenches. The shallow trench isolations may be formed by performing a brief thermal oxidation of the silicon germanium, followed by deposition of a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process, leaving shallow trench isolations 48 that are approximately level with the surface of the silicon germanium layer 40. The typical processing involved in formation of the shallow trench isolations 48 may utilize temperatures in excess of 1000 degrees C. By forming the shallow trench isolations 48 prior to formation of strained silicon, the strained silicon is not subjected to such temperatures and therefore shallow trench isolation processing is eliminated as a potential source of misfit dislocations.

Figure 2D:
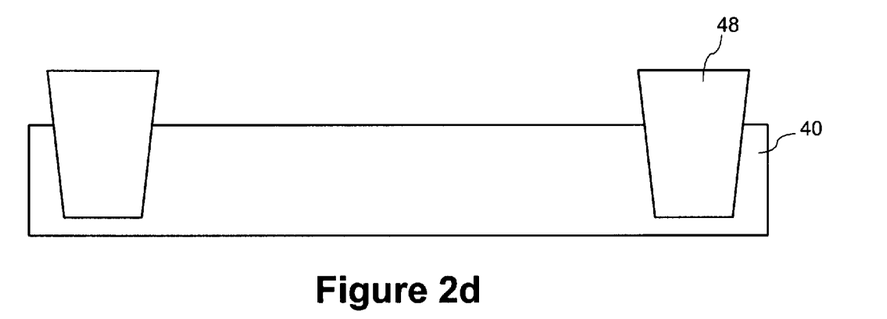
Figure 2E:
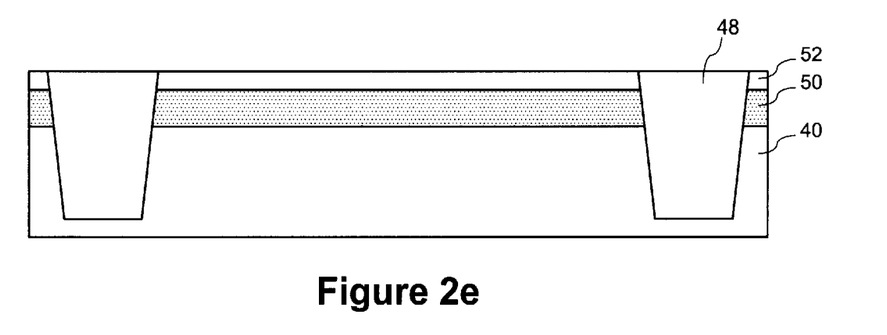

FIG. 2d shows the structure of FIG. 2c after performing an etch back process to remove material from the surface of the silicon germanium layer 40. FIG. 2e shows the structure of FIG. 2d after formation of a layer of strained silicon 50 on the silicon germanium 40 and formation of an upper layer of silicon germanium 52 overlying the layer of strained silicon 50. The etch back that yields the structure of FIG. 2d is performed so as to remove a portion of the silicon germanium layer 40 to lower the upper surface of the silicon germanium layer 40 relative to the upper surfaces of the shallow trench isolations 48, so that the upper surfaces of the shallow trench isolations 48 are approximately level with the upper surface of the later formed upper silicon germanium layer 52. However, the amount removed may be varied.

The strained silicon layer 50 is preferably grown by selective epitaxial growth through a chemical vapor deposition (CVD) process, for example using $Si_2H_6$ as a source gas with a partial pressure of 30 mPa and a substrate temperature of approximately 600 to 900 degrees C. The strained silicon layer 50 and the upper silicon germanium layer 52 are grown in a single continuous in situ process, preferably with minimal cooling or heating of the strained silicon layer 50 prior to formation of the upper silicon germanium layer 52. This may be achieved by introducing a germanium source gas (e.g. germane) into the deposition chamber after a desired thickness of strained silicon has been grown in order to the change the composition of the deposited material from silicon to silicon germanium having the desired germanium content without significantly altering the temperature of the strained silicon layer. It may also be desirable to grade any changes of temperature between the optimal strained silicon deposition temperature and the optimal silicon germanium deposition temperature in a manner that takes into account the thickness of silicon germanium grown on the strained silicon layer so that an appropriate amount of silicon germanium is present on the upper surface of the strained silicon layer to provide support for the strained silicon layer as temperature changes occur. The upper silicon germanium layer 52 is formed to have the same germanium content (e.g. approximately 30%) at its junction with the strained silicon layer 50 as the lower silicon germanium layer 40 so as to provide maximum support of the tensile strain induced in the strained silicon layer 50, but may thereafter be graded if desired. The thickness of the upper silicon germanium layer 52 may be determined in accordance with the particular application.

As noted above, a silicon germanium layer having approximately 30% germanium content is capable of supporting a strained silicon layer of approximately 80 Angstroms without the risk of significant misfit dislocations during cooling or subsequent thermal processing. In contrast, the strained silicon layer 50 of the preferred embodiment is supported at both of its surfaces by the lower and upper silicon germanium layers 40, 52 each having approximately 30% germanium contents. Therefore the strained silicon layer 50 may be formed to have a thickness of greater than approximately 80 Angstroms, typically in excess of approximately 140 Angstroms, and potentially as much as approximately 160 Angstroms, without the risk of significant misfit dislocations during cooling or subsequent thermal processing.

Figure 2F:
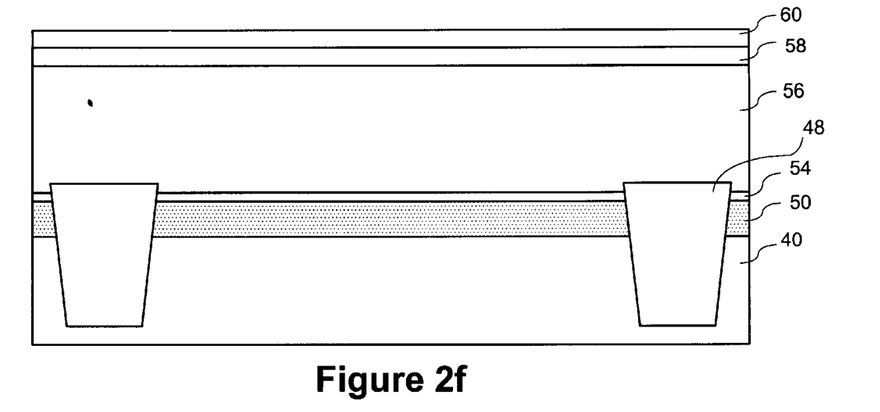

FIG. 2f shows the structure of FIG. 2e after removal of the second layer of silicon germanium, followed by the formation of several layers of different materials. The upper silicon germanium layer may be removed by a selective wet etch that has a very high etch selectivity for silicon germanium compared to silicon. Alternately, the silicon germanium may be oxidized through a highly controllable oxidation process, such as using hot steam, followed by removal in an HF solution. The presence of the upper silicon germanium layer during cooling prior to further processing provides additional resistance against misfit dislocation formation during cooling. The layers of material that are formed include a gate insulating layer 54 that is formed on the strained silicon layer 50. The gate insulating layer 54 is typically silicon oxide but may be another material such as oxide-nitride-oxide (ONO). An oxide may be grown by thermal oxidation of the strained silicon layer, or may be deposited by chemical vapor deposition. Formed over the gate insulating layer 54 is a gate conductive layer 56. The gate conductive layer 56 typically comprises polysilicon but may alternatively comprise another material such as polysilicon implanted with germanium. Overlying the gate conductive layer 56 is a bi-layer hardmask structure comprising a bottom hardmask layer 58, also referred to as a bottom antireflective coating (BARC), and an upper hardmask layer 60. The bottom hardmask layer 58 is typically silicon oxide (e.g. $SiO_2$) and the upper hardmask layer 60 is typically silicon nitride (e.g. $Si_3N_4$).

Figure 2G:
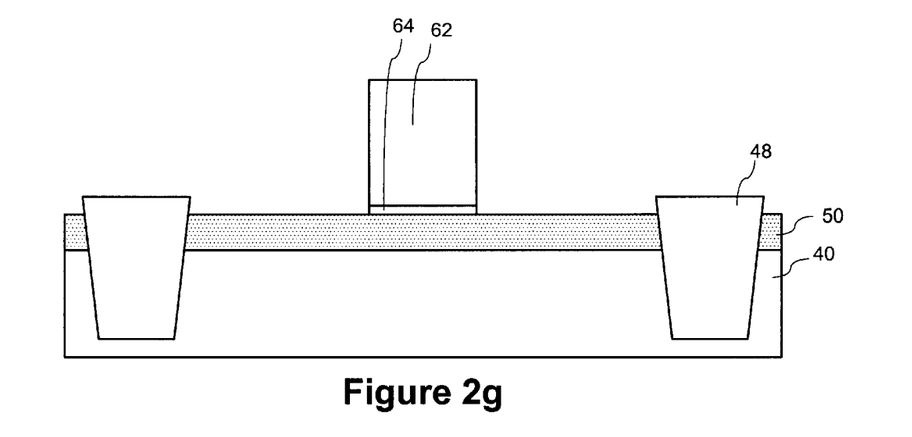

FIG. 2g shows the structure of FIG. 2f after patterning of the gate conductive layer and gate insulating layer to form a gate 62 and a self-aligned gate insulator 64. Patterning is performed using a series of anisotropic etches that patterns the upper hardmask layer using a photoresist mask as an etch mask, then patterns the lower hardmask layer using the patterned upper hardmask layer as an etch mask, then patterns the gate conductive layer using the patterned lower hardmask layer as an etch mask, then patterns the gate insulating layer using the gate 62 as a hardmask.

Figure 2H:
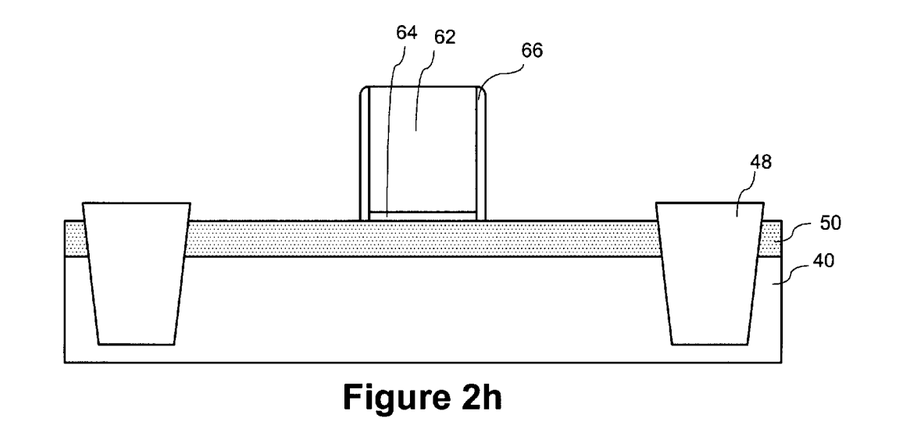

FIG. 2h shows the structure of FIG. 2g after formation of a thin first gate spacer 66 around the gate 62 and gate insulator 64. The thin first gate spacer 60 is preferably formed by deposition of a conformal layer of a protective material followed by anisotropic etching to remove the protective material from the non-vertical surfaces to leave the thin first gate spacer 66 formed around the gate 62 and gate insulator 64. The thin first gate spacer 66 is preferably formed of silicon oxide or silicon nitride.

Figure 2I:
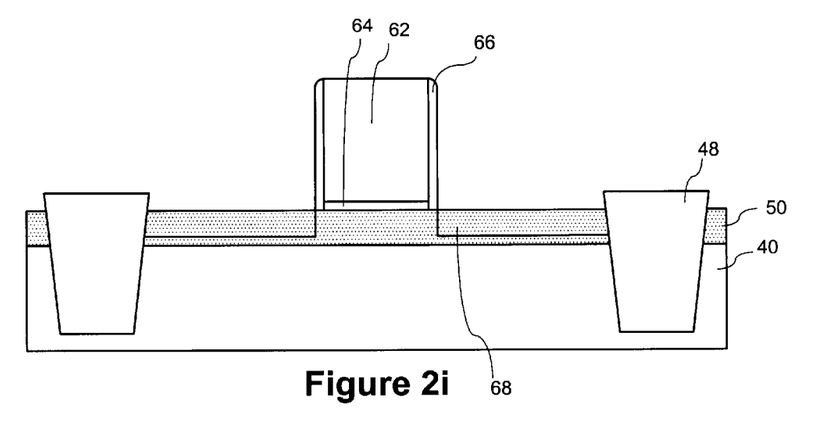

FIG. 2i shows the structure of FIG. 2h after implantation of dopant to form shallow source and drain extensions 68 in the strained silicon layer 50 at opposing sides of the channel region. Halo regions (not shown) may be implanted prior to implantation of the shallow source and drain extensions. Halo regions are regions that are doped with a dopant that is opposite in conductivity to the dopant of the source and drain extensions 68. The halo regions help to suppress the short channel "punchthrough" effect by shortening the depletion regions at the ends of the source and drain extensions 68. The halo regions are preferably implanted using a low energy at a small angle to the surface of the substrate so that the halo regions extend beneath the gate 62 to beyond the anticipated locations of the ends of the source and drain extensions 68 after annealing. Like the source and drain extensions 68, the halo regions are formed at opposing sides of the channel region and extend toward the channel region beyond the ends of the source and drain extensions to be formed.

Figure 2J:
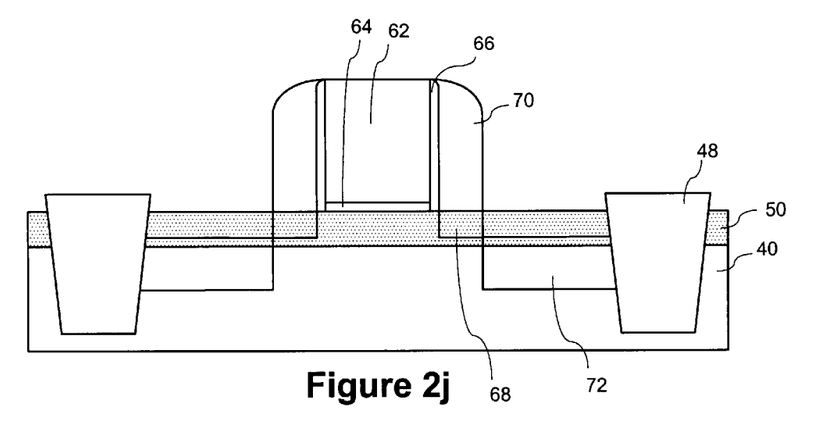

FIG. 2j shows the structure of FIG. 2i after formation of a second spacer 70 around the gate 62 and the thin first spacer 66, followed by implantation of dopant to form deep source and drain regions 72 in the strained silicon 50 and silicon germanium 40 layers. The second spacer 70 serves as an implant mask during implantation of the deep source and drain regions 72 to define the position of the source and drain regions 72 relative to the channel region of the MOSFET. The depth of the deep source and drain regions 72 extends beyond the strained silicon layer 50 into the lower silicon germanium layer 40.

Figure 2K:
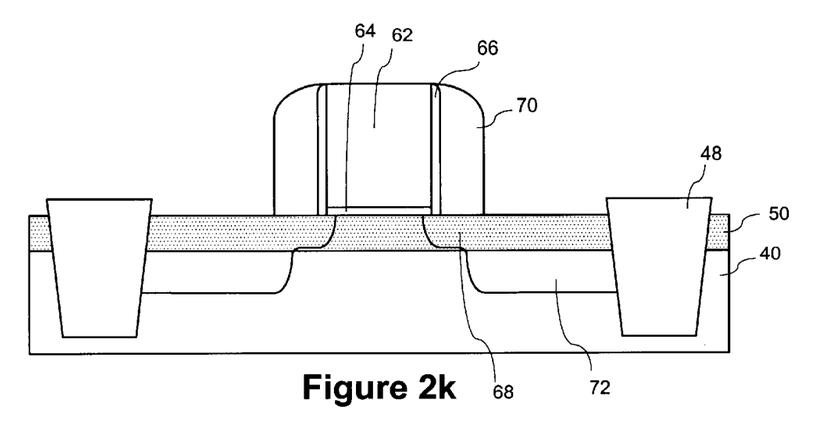

FIG. 2k shows the structure of FIG. 2j after performing rapid thermal annealing (RTA) to anneal the strained silicon layer 50 and silicon germanium layer 40 and to activate the dopants implanted in the shallow source and drain extensions 68 and the deep source and drain regions 72. During annealing some diffusion of implanted dopant occurs in the strained silicon layer 50 and the silicon germanium layer 40.

Figure 2L:
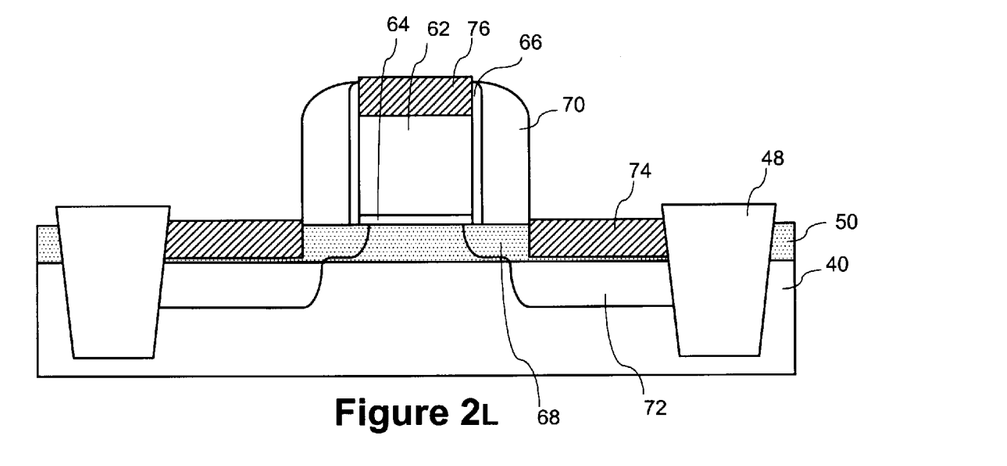

FIG. 2L shows the structure of FIG. 2k after formation of silicide contacts 74 on the source and drain regions 72 and formation of a silicide contact 76 on the gate 62. The silicide contacts are formed of an compound comprising a semiconductor material and a metal. Typically a metal such as cobalt (Co) is used, however other metals such as nickel (Ni) may also be employed. The silicide contacts are formed by depositing a thin conformal layer of the metal over the substrate, and then annealing to promote silicide formation at the points of contact between the metal and underlying semiconductor materials, followed by removal of residual metal.

Figure 3:
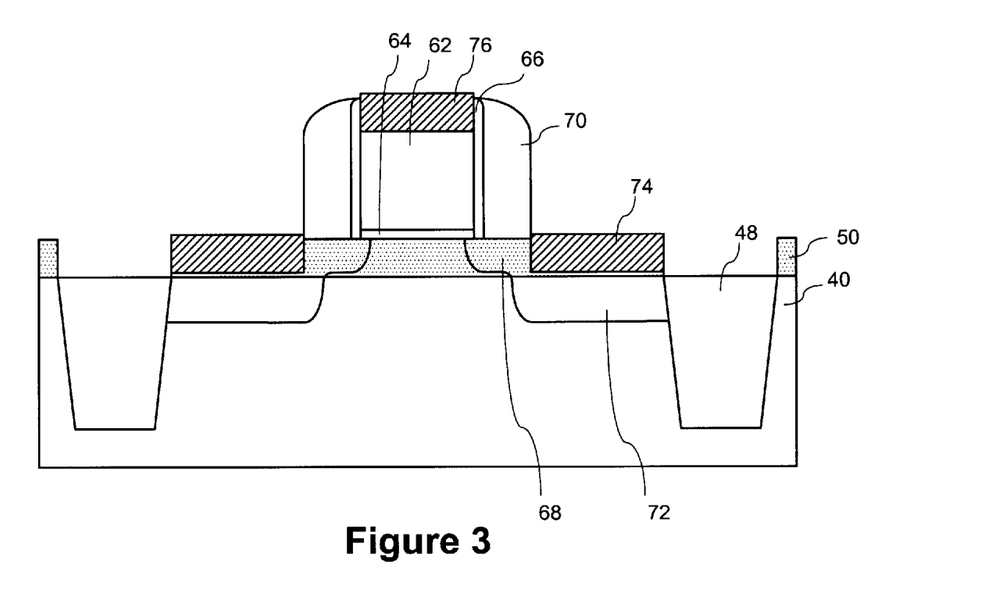
FIG. 3 shows a structure formed in accordance with an alternative embodiment.

An alternative to the embodiment of FIGS. 2a–2L is shown in FIG. 3. The embodiment of FIG. 3 differs from the embodiment of FIGS. 2a–2L in that the etch back processing performed on the silicon germanium layer of FIG. 2c to yield the structure of FIG. 2d is omitted. As a result, the upper surface of the lower silicon germanium layer 40 is approximately level with the upper surfaces of the shallow trench isolations 48, and the strained silicon layer 50 that is subsequently formed by selective growth on the silicon germanium layer 40 extends above the upper surfaces of the shallow trench isolations 48. Because a selective growth process is used, little or no silicon growth occurs on the silicon oxide shallow trench isolations 48. Therefore the regions above the shallow trench isolations 48 remain empty and are filled in later processing when a protective layer such as BPSG is applied.

Figure 4:
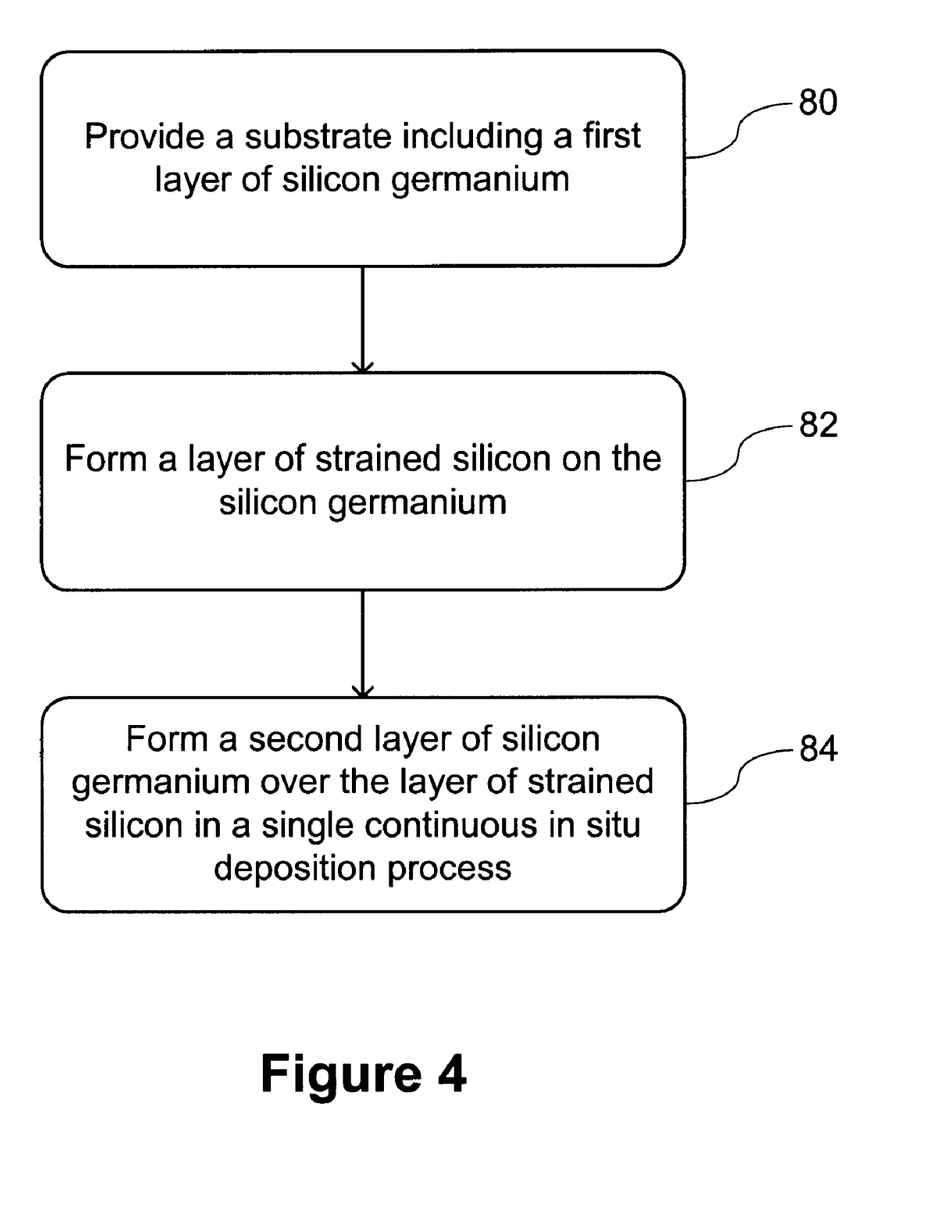
FIG. 4 shows a process flow encompassing the first preferred embodiment and alternative embodiments.

Device construction is therefore not limited to the embodiment of FIGS. 2a–2L. FIG. 4 shows a process flow for forming a strained silicon layer that encompasses the preferred embodiment of FIGS. 2a–2L, the aforementioned alternative embodiments and other alternatives. Initially a substrate is provided (80). The substrate includes a first layer of silicon germanium. A layer of strained silicon is then formed on the first layer of silicon germanium (82). The layer of strained silicon preferably has a thickness in excess of the conventional critical thickness determined in accordance with the germanium content of the first layer of silicon germanium. A second layer of silicon germanium is then formed on the layer of strained silicon in a single continuous in situ deposition process with the strained silicon (84). The first and second silicon germanium layers maintain the tensile strain of the strained silicon layer and resist the formation of misfit dislocations in the strained silicon layer even where the strained silicon layer has a thickness in excess of the critical thickness.

Figure 5:
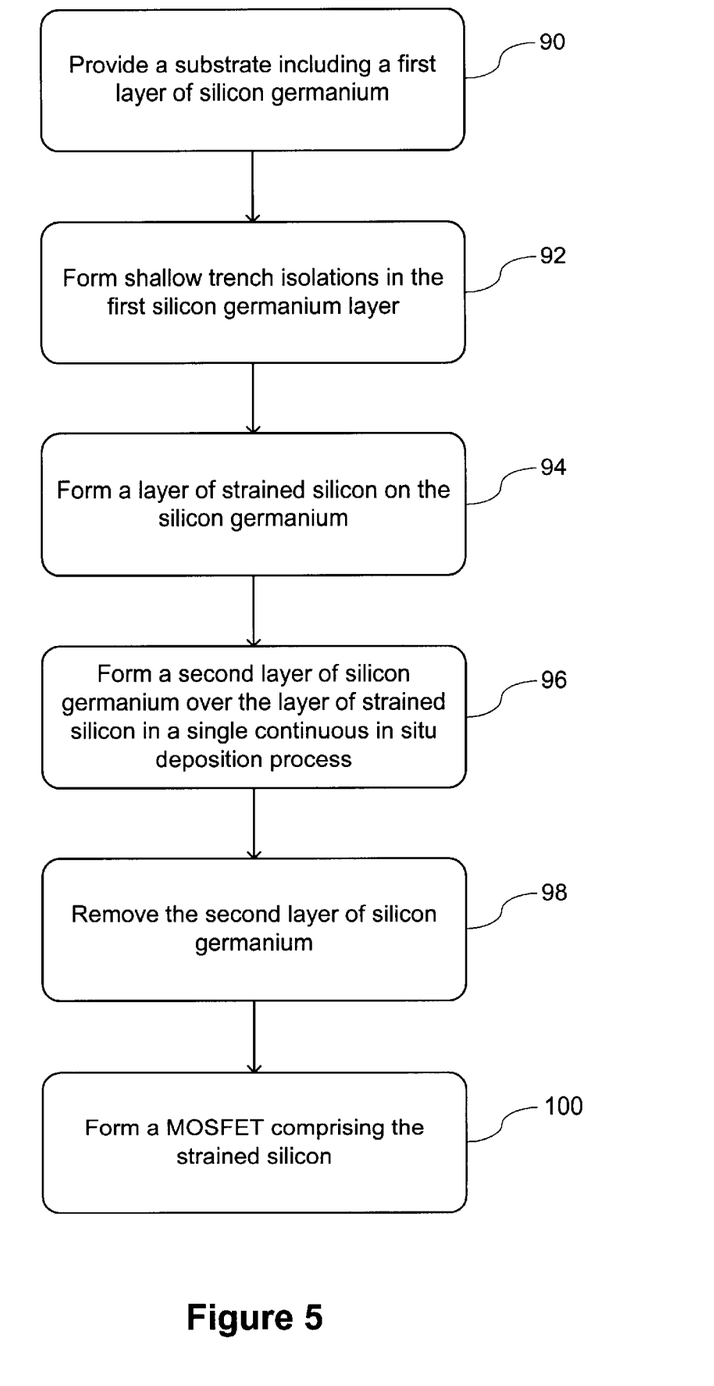
FIG. 5 shows a process flow encompassing the first preferred embodiment and alternative embodiments.

FIG. 5 shows a process flow for forming a semiconductor device that encompasses the preferred embodiment of FIGS. 2a–2L, the alternative embodiment of FIG. 3, and other alternative embodiments. Initially a substrate is provided (90). The substrate includes a first layer of silicon germanium. Shallow trench isolations are then formed in the silicon germanium layer (92). A layer of strained silicon is then formed on the first layer of silicon germanium (94), and a second layer of silicon germanium is then formed on the layer of strained silicon in a single continuous in situ deposition process with the strained silicon layer (96). An etch back process may be performed on the first silicon germanium layer prior to formation of the layer of strained silicon. The second layer of silicon germanium is then removed (98), and a MOSFET comprising the strained silicon layer is formed between shallow trench isolations (100).

In accordance with further embodiments it may be desirable to implement additional features. In one embodiment, the oxide or oxide-nitride-oxide gate insulating layer is replaced with a crystalline high-k dielectric layer that has a lattice constant that is comparable to that of the lower silicon germanium layer and therefore provides additional support for the tensile strain in the strained silicon layer. For example, for a 20% silicon germanium layer, a gate insulating layer of crystalline $DyScO_3$ or $GaScO_3$ provides a suitable lattice. Such crystals may be grown by molecular beam epitaxy (MBE). In a further embodiment, a crystalline high-k dielectric layer may be used as a dielectric substrate in a silicon on insulator construction, and may also be used as a gate insulating material in such a construction.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counterdoping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for forming a strained silicon layer, comprising:

providing a substrate comprising a first layer of silicon germanium;

forming a layer of strained silicon on the first layer of silicon germanium; and forming a second layer of silicon germanium on the strained silicon layer in a single continuous in situ deposition process with the layer of strained silicon, wherein the first and second silicon germanium layers support a tensile strain of the strained silicon layer and resist the formation of misfit dislocations in the strained silicon layer.

2. The method claimed in claim 1, wherein the first silicon germanium layer has a composition $Si_{1-x}Ge_x$, where x is in the range of 0.1 to 0.4.

3. The method claimed in claim 2, wherein x is approximately 0.3 and the thickness of the strained silicon layer exceeds 140 Angstroms.

4. The method claimed in claim 1, wherein the first and second silicon germanium layers have an approximately equal germanium content at respective junctions with the strained silicon layer.

5. The method claimed in claim 1, wherein the layer of strained silicon has a thickness in excess of a critical thickness determined in accordance with a germanium content of the first layer of silicon germanium.

6. A method for forming a semiconductor device, comprising:

provi ding a substrate comprising a first layer of silicon germanium;

forming shallow trench isolations in the first layer of silicon germanium;

forming a layer of strained silicon on the first layer of silicon germanium; and forming a second layer of silicon germanium on the strained silicon layer in a single continuous in situ deposition process with the layer of strained silicon, wherein the first and second silicon germanium layers support a tensile strain of the strained silicon layer and resist the formation of misfit dislocations in the strained silicon layer.

7. The method claimed in claim 6, wherein the layer of strained silicon has a thickness in excess of a critical thickness determined in accordance with a germanium content of the first layer of silicon germanium.

8. The method claimed in claim 6, wherein the first silicon germanium layer and the second silicon germanium layer each have a composition $Si_{1-x}Ge_x$, where x is in the range of 0.1 to 0.4.

9. The method claimed in claim 8, wherein the first silicon germanium layer and the second silicon germanium layer each have a germanium content of approximately 30%.

10. The method claimed in claim 9, wherein the thickness of the strained silicon layer exceeds 140 Angstroms.

11. The method claimed in claim 6, wherein the first and second silicon germanium layers have an approximately equal germanium contents at their junctions with the strained silicon layer.

12. The method claimed in claim 6, further comprising:

removing the second layer of silicon germanium; and forming a metal oxide semiconductor field effect transistor (MOSFET) comprising the layer of strained silicon between the shallow trench isolations.

13. The method claimed in claim 12, wherein the strained silicon layer is cooled prior to removing the second layer of silicon germanium.

14. The method claimed in claim 12, wherein forming a MOSFET on the strained silicon comprises:

forming a gate insulating layer on the strained silicon layer;

forming a gate conductive layer on the gate insulating layer;

patterning the gate conductive layer and the gate insulating layer to form a gate overlying a gate insulator;

implanting shallow source and drain extensions;

implanting deep source and drain regions; and forming silicide source and drain contacts and a silicide gate contact.

15. The method claimed in claim 14, wherein the silicide source and drain contacts and the silicide gate contact comprise nickel.

16. The method claimed in claim 14, wherein implanting shallow source and drain extensions is preceded by forming a first spacer around the gate and gate insulator.

17. The method claimed in claim 16, wherein implanting deep source and drain regions is preceded by forming a second spacer around the first spacer, and wherein the second spacer serves as an implantation mask during implanting of the deep source and drain regions.

18. The method claimed in claim 14, further comprising annealing to activate implanted dopants.

19. The method claimed in claim 14, wherein implanting source and drain extensions is preceded by implanting halo regions, the halo regions extending toward a channel region beyond ends of the source and drain extensions to be formed, the halo regions comprising a dopant having a conductivity type opposite to the conductivity type of a dopant of the source and drain extensions.

20. The method claimed in claim 6, wherein forming the strained silicon layer is preceded by removing a portion of the first silicon germanium layer to lower an upper surface of the first silicon germanium layer relative to upper surfaces of the shallow trench isolations.

* * * * *